United States Patent
Doutre et al.

(10) Patent No.: US 6,257,312 B1
(45) Date of Patent: Jul. 10, 2001

(54) PREPARATION OF METAL-MATRIX COMPOSITE MATERIALS WITH HIGH PARTICULATE LOADINGS BY CONCENTRATION

(75) Inventors: Don Doutre, Kingston; Gary Hay, Ontario; Iljoon Jin; Peter Wales, both of Kingston; David J. Lloyd, Bath, all of (CA)

(73) Assignee: Alcan International Limited, Montreal (CA)

( * ) Notice: Subject to any disclaimer, the term of this patent is extended or adjusted under 35 U.S.C. 154(b) by 0 days.

(21) Appl. No.: 09/131,131

(22) Filed: Aug. 7, 1998

(51) Int. Cl.[7] ............................. B22D 19/14; B22D 27/15
(52) U.S. Cl. ................... 164/97; 164/98; 164/61; 164/63; 164/65
(58) Field of Search ................... 164/97, 98, 61, 164/62, 63, 65

(56) References Cited

U.S. PATENT DOCUMENTS

| | | | |
|---|---|---|---|
| 4,569,218 | 2/1986 | Baker et al. | 72/342 |
| 4,769,158 | 9/1988 | Ekert | 210/780 |
| 4,872,908 | 10/1989 | Enright | 75/68 R |
| 4,874,029 | * 10/1989 | Chandley | 164/63 |
| 5,114,472 | 5/1992 | Eckert et al. | 75/412 |
| 5,198,167 | * 3/1993 | Ohta et al. | 164/97 |
| 5,246,057 | * 9/1993 | Hansson et al. | 164/97 |
| 5,322,546 | 6/1994 | Holsgrove et al. | 75/407 |
| 5,477,905 | * 12/1995 | Knapp et al. | 164/61 |
| 5,944,097 | * 8/1999 | Gungor et al. | 164/97 |

FOREIGN PATENT DOCUMENTS

| | | |
|---|---|---|
| 2 275 008B | 1/1996 | (GB) . |
| 59-202063 | 11/1984 | (JP) . |
| 61-243133 | 10/1986 | (JP) . |
| 3-6063 | 1/1991 | (JP) . |
| 3-5063 | * 1/1999 | (JP) . |
| WO 92/13689 | 8/1992 | (WO) . |

OTHER PUBLICATIONS

Perry et al., "Chemical Engineers' Handbook", Fifth Edition 1973, pp. 5–38.

Premkumar et al., "Aluminum Composite Materials for Multichip Modules", JOM (Journal of Metals), Jul. 1992, pp. 24–28.

Enright et al., "Volumes of MMC, An Economic Alternative to Bulk Metal Handling", Proc. 26th International Symposium on Automotive Technology and Automation, Sep. 1993, pp. 545–551.

Richards, "RIMLOC–A single shot casting technique for the future", *Aluminum Today*, Dec. 1996/Jan. 1997, pp. 33–37.

* cited by examiner

*Primary Examiner*—Nam Nguyen
*Assistant Examiner*—I.-H. Lin
(74) *Attorney, Agent, or Firm*—Gregory Garmong

(57) ABSTRACT

A composite material having less than about 25 volume percent refractory particles in a metal matrix is concentrated to have about 37–45 volume percent refractory particles. The concentrating is accomplished by heating the composite material to melt the matrix, and then contacting the molten composite material to a porous element having an average pore size greater than that of the average particle size. A small pressure differential, on the order of about one atmosphere, is applied across the porous element, so that metal matrix material separates from the composite material and flows through the porous element. The particulate volume fraction in the composite material gradually increases. When the particulate volume fraction exceeds about 37 volume percent, the mass of composite material becomes semi-solid and freestanding. The resulting composite material may be further processed, as by forming to a useful shape or diluting with another matrix material.

19 Claims, 3 Drawing Sheets

PREPARATION OF METAL-MATRIX COMPOSITE MATERIALS WITH HIGH PARTICULATE LOADINGS BY CONCENTRATION

BACKGROUND OF THE INVENTION

This invention relates to the manufacture of metal matrix composites having high particulate loadings and, more particularly, to the concentration of composite materials with lower particulate loadings to achieve higher particulate loadings.

Metal matrix composites, for example those consisting of refractory particles such as silicon carbide or alumina distributed in aluminum alloy matrices, are most economically manufactured on a large scale by mixing techniques. One such technique, described in U.S. Pat. No. 4,759,995, disperses and wets refractory particles with molten metal using a shearing technique while avoiding the retention and incorporation of gases. Such mixing techniques are frequently restricted to relatively low particulate loadings (e.g. less than about 25 volume percent particulate) because of fluidity problems encountered during mixing.

On the other hand, metal matrix composites used in large-scale shape casting processes and similar applications most frequently use the same or lower solids loading because of similar fluidity constraints. As a result, scrap material from such casting processes having relatively low particulate loading is frequently available as a byproduct from such operations.

Higher solids-loading material is typically prepared by pressure-assisted or other infiltration techniques. These higher solids-loading materials are useful in certain structural and electronic applications, but because of the difficulty in producing and processing such materials, they have not found wide application.

There is a need for a less costly method for manufacturing higher solids loading metal matrix composites, ideally one which uses the proven cost advantages of the various processes for manufacturing low solids loading materials or which uses available scrap materials. There is further a need for methods for manufacturing high solids loading materials that can be readily cast, forged or otherwise manufactured by methods suitable for high volume production. The present invention fulfills this need, and further provides related advantages.

SUMMARY OF THE INVENTION

This invention relates to the preparation and use of metal-matrix composite materials having a high particulate loading. A metal-matrix composite material having lower particulate loading is prepared and thereafter concentrated to a higher particulate loading. The approach produces a composite material with a high particulate loading wherein the particles are not agglomerated, and is economical. The concentrated, high-particulate-loading composite material may be used in thixoforming operations or diluted with the addition of other matrix alloys to produce a lower-particulate-loading material with a different matrix than that first prepared.

In accordance with the invention, a method for preparing a metal matrix composite has as a starting material an initial composite material having a plurality of particles with an average particle size, and a molten metal matrix. The method uses a container having an exit channel and a porous element within the exit channel. The porous element has an average pore size opening such that, under a pressure differential, molten matrix metal but no substantial amount of particles pass through the porous material. The method is practiced by placing the initial composite material into the container in contact with the porous element, and creating a pressure differential in the initial composite material across the porous element sufficient to cause the matrix metal to flow through the porous element and leave a final composite material in the container. The step of creating a pressure differential is continued for a time sufficient that the final composite material is a self-supporting mass.

The initial composite material preferably is prepared by a technique such as that described in U.S. Pat. No. 4,759,995, which results in a structure having wetted particles in a metallic matrix. Such a process is most readily applied to produce composites having at least about 5 volume percent particulate, preferably from about 5 volume percent to about 25 volume percent of particulate, a relatively low particulate loading. The porous element has an average pore size larger than the average particle size, and typically at least about 2 times the average particle size. Larger pore sizes may also be used, as where the average pore size is at least about 5 times the average particle size, but less than about 25 times the average particle size.

The initial composite material, with the matrix molten, is contacted to one side of the porous element. A pressure differential, typically about 0.2–2 atmospheres, is applied across the porous element, either by application of a vacuum on the downstream side of the porous element or a pressure to the initial composite material on the upstream side of the porous element. Matrix metal from the composite material separates from the composite material and flows through the porous element, causing the particle volume fraction of the composite material remaining on the upstream side of the porous element to gradually increase.

The concentrating of the particulate by removal of the metal matrix is continued for a period of seconds to a few minutes until, when the particle volume fraction reaches the range of about 37 to about 45 volume percent, the composite material becomes self-supporting. This final composite material separates from the sidewall of the container, and may be removed from the container as a freestanding mass.

The self-supporting final composite material may be used in any appropriate fashion. For example, it may be formed directly to a useful shape having the particulate loading produced in the concentrating operation, in a manner similar to thixoforging. It may instead be modified by the addition of the same matrix metal to produce a composite material having an intermediate, lower volume fraction of particulate, such as in the range of from about 25 to about 37 volume percent of particulate. Composite materials with the particulate loading in this range may be difficult to produce directly by mixing techniques. When such composites of intermediate particulate loading are produced directly by conventional infiltration and subsequent dilution, there is an undesirable tendency for the particulate to agglomerate into clusters of particles that are only partially wetted by the matrix metal, leading to difficulties during dilution and reduced mechanical properties of the final product. By contrast, any agglomerated particles produced by the present approach are wetted by the matrix metal, resulting in acceptable properties of the final composite material. In yet another use of the concentrated composite material, a second, different molten metallic material is mixed with the concentrated composite material, simultaneously reducing the particulate loading and also altering the composition of the matrix alloy. By this approach, either intermediate or lower particle loading composite materials may be produced with matrix alloys that cannot be otherwise used.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
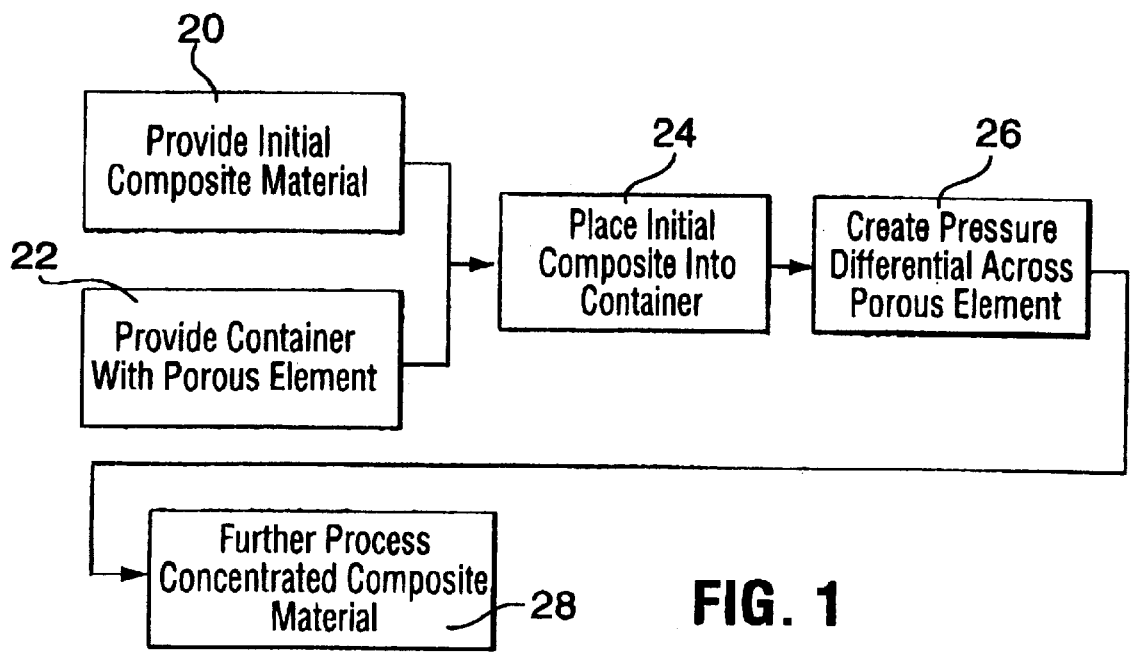
FIG. 1 is a block diagram of a method of practicing the present invention.

FIG. 1 depicts a preferred approach for practicing the invention. An initial composite material is provided, numeral 20. The initial composite material is formed of refractory particles in a metallic matrix. The refractory particles may be any operable composition that does not dissolve in the molten metallic matrix, with silicon carbide and aluminum oxide particles preferred. The refractory particles are of any operable shape, but typically are nearly equiaxed. The refractory particles are of any operable size, and for usual commercial applications are in the range of from about 5 to about 50 micrometers in maximum dimension. The metallic matrix may be of any operable pure metal or alloy, with aluminum-base and magnesium-base alloys preferred.

The initial composite material may be provided by any operable approach. The melting and mixing approach such as that described in U.S. Pat. No. 4,759,995 is preferred, if the initial composite material is prepared specifically for use in the present processing. Generally, in this technique the matrix metal is melted, and then the particulate is gradually added and stirred into the melt under conditions so as to minimize the retention in and introduction of air into the melt. With this approach and comparable melt approaches for preparing metal-matrix composite materials, mixing composite materials with less than about 25 volume percent of particulate (low particulate loading) is readily accomplished. It is more difficult to mix composite materials with about 25 volume percent of particulate or more, and very difficult to mix composite materials with more than about 30 volume percent of particulate.

The initial composite material may also be provided from other sources. For example, the initial composite material may be scrap produced in various manufacturing operations, or scrapped articles that have completed their useful lives but are otherwise suitable for recycling. The ability to alter the matrix composition of the concentrated composite material, to be discussed subsequently, is particularly advantageous when the initial composite material is scrap of various types, because the matrix may be altered to a new desired composition as part of the processing.

The initial composite material has at least about 5 volume percent of particulate, preferably at least about 10 volume percent of particulate, and preferably less than about 25 volume percent of particulate. Initial composite material with a lower volume fractions of particulate does not achieve concentration in an acceptable manner, probably due to an absence of a clustering of the particles in the initial composite material during the concentration processing. Initial composite material with a higher volume fraction of particulate may be used, but such material is difficult and uneconomical to produce initially so that its use serves little purpose.

Figure 2:
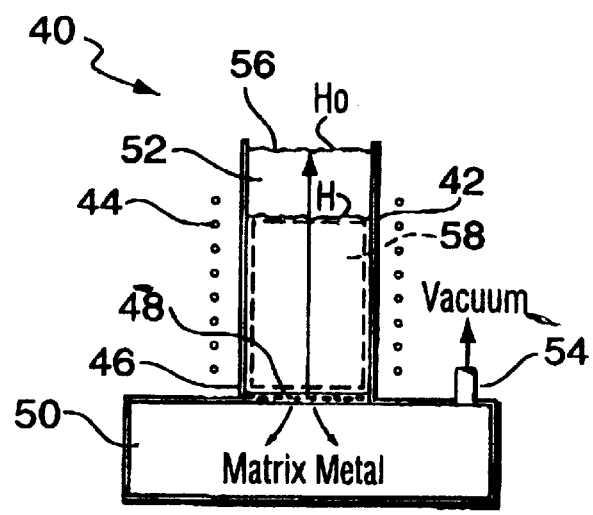
FIG. 2 depicts an apparatus used to carry out the process of this invention.

A container and a porous element are provided, numeral 22. FIG. 2 illustrates a preferred apparatus 40 for practicing the invention. The apparatus includes a container 42 made of a material that will withstand contact with the molten composite material. Preferably, the container 42 is an insulated mold. The container 42 is preferably preheated by placing it inside an oven, indicated schematically by electrical resistance windings 44. The container 42 includes an exit channel 46, typically at the bottom of the container 42.

A porous element 48 is placed in the exit channel 46 such that any metal flowing through the exit channel 46 must pass through the porous element. The porous element 48 has porosity therethrough with an average pore size that is specified by the manufacturer of the porous element. The average pore size is selected such that no molten matrix metal flows therethrough absent an applied differential pressure, but that molten matrix metal flows through the pores and through the porous element 48 when a differential pressure is applied across the porous element 48. The average pore size is greater than the average particle diameter of the initial composite material, preferably at least twice the average particle diameter, and most preferably at least five times the average particle diameter. With increasing pore size, the flow rate of the molten metal under an applied differential pressure increases, so that the subsequently described processing becomes more economical. It is preferred that the average pore size not exceed about 25 times the average particle size, or particles will flow through the porous element and be lost during subsequent processing steps.

The porous element may be of any operable type, such as a ceramic foam filter, a sintered refractory filter, a cloth screen filter, or a wire mesh filter. The wire mesh filter is preferred. Such wire mesh filters are available commercially with average pore sizes ranging from about 100 micrometers to about 400 micrometers, from suppliers such as Crooks Wire Products, Mississauga, Ontario, Canada.

The apparatus further includes a catch basin 50 for receiving molten metal that flows through the porous element 48 and the exit channel 46.

A charge 52 of the initial composite material is placed into contact with a first side of the porous element 48, numeral 24. In the preferred apparatus, the initial composite material is placed into the container 42, so that it rests against the upper side of the porous element 48 under the force of gravity. Before it is poured into the preheated container 42, the charge 52 is preferably heated to a temperature greater than the melting point of the metal matrix alloy, so that the charge is a slurry of the particles in the molten matrix alloy. However, because of the selection of the pore size of the porous element 48, the charge 52 resides on top of the porous element 48 with little if any molten metal flowing through the porous element 48.

A differential pressure is applied across the porous element 48, numeral 26, and thence between the charge 52 and the interior of the catch basin 50. The differential pressure may be applied with a vacuum applied to the catch basin 50. FIG. 2 illustrates the preferred approach for applying a vacuum through a vacuum port 54 extending into the catch basin 50. The differential pressure may equivalently for the present purposes be applied with a pressure applied to the change 52. The differential pressure is preferably from about 0.2 to about 2 atmospheres, most preferably from about 0.5 to about 1 atmosphere.

With the application of the differential pressure, liquid metal matrix material begins to flow through the porous element 48. The liquid metal flows to the catch basin 50, where it may be collected for subsequent measurement of its volume. The particulate in the composite material of the charge does not flow through the porous element 48 in any substantial amount.

The progress of the liquid matrix metal flowing through the porous element 48 may be followed by observing the level H of an upper surface 56 of the charge 52 above the top of the porous element 48. The upper surface 56 is initially at a height $H_O$. The height H of the upper surface of the charge 52 gradually lowers, marking the progress of the flow of the liquid metal through the porous element 48 to the catch basin 50.

Figure 3:
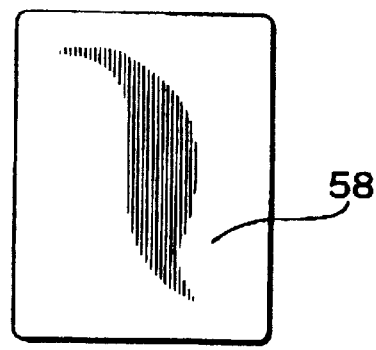
FIG. 3 is an elevational view of a self supporting ingot of the concentrated composite material at a temperature greater than the melting point of the matrix alloy.

Simultaneously with the flow of liquid matrix metal through the porous element 48, the volume fraction of particulate in the charge above the porous element 48 increases and the mass of composite material remaining in the container 42 becomes more concentrated in particulate. When the volume fraction of particulate becomes sufficiently large, the mass of composite material becomes self-supporting. The self-supporting mass 58, shown in FIG. 3, draws inwardly and away from the walls of the container 42 to stand in a freestanding manner within the container, if the differential pressure is applied by a vacuum. This inward drawing of the self-supporting mass permits easy visual determination of the attaining of the self-supported state and easy removal of the self-supporting mass from the container. If the differential pressure is applied by a positive pressure, the results are the same except that the self-supporting mass does not draw away from the walls, and for this reason the use of the vacuum is preferred. The transformation from a flowable composite material to a self-supporting mass typically occurs when the volume fraction of particulate in the mass reaches from about 37 to about 45 volume percent, which is termed a concentrated composite material. The viscosity of the self-supporting mass is so high that it does not deform as a fluid, even though it contains on the order of 60 percent by volume of liquid metal. Instead, it holds its shape in the manner of a solid, but it may be deformed with the application of appropriate forces, as will be discussed subsequently. The self-supporting mass is characterized by an absence of porosity and by full wetting of the matrix alloy to the particulate material, unlike the filter cakes produced by conventional filtering techniques.

While not wishing to be bound by any theory, it is believed that the following happens in the process. When a dilute metal matrix composite is poured into the apparatus 40, the metal matrix composite material will not flow through the porous element even though the openings may greatly exceed the average particle size The application of a relatively small pressure differential is sufficient to cause metal to flow through the filter element, but the surface tension between the particles and metal is not overcome so particles are retained on the upstream side of the filter element.

Once sufficient metal has been removed such that the particles come into touching contact, no further metal can be removed by the relatively gentle pressure differentials used since to remove such metal would require draining molten metal from between touching particles. This endpoint occurs at substantially the same solids loading in a wide variety of composite materials, on the order of from about 37 to about 45 volume percent particulate. Because of the particle-particle contact the material behaves as a fluid with non-Newtonian behavior in that the curve (which may be linear or nonlinear) describing the relationship between the shear stress and the shear rate for the fluid does not pass through the origin, but instead intercepts the shear stress axis at a non-zero value.

The mass 58 is self-supporting, yet will flow so as to be moldable when a minimum shear force is applied. When the mass is flowing under shear, the higher the shear rate, the lower the viscosity of the material. The present process does not work well under normal filtration conditions, wherein the filter size opening is less than the average particle size. In such cases the flow rate of the metal through the porous element 48 is so slow that the process is uneconomical. To achieve a sufficiently high flow rate with a porous element having a small filter size opening, the differential pressure applied across the porous element would have to be so high that the particle arrangement is disrupted.

The self-supporting material produced by the present approach has flow properties different from those of materials of similar volume fractions produced by different techniques, which properties are beneficial to the utilization of the material. At a temperature above the melting point of the matrix, the self-supporting material produced by the present approach exhibits its non-Newtonian behavior through its response to a rod penetration test. In comparative testing, a preheated graphite rod 6.15 millimeters in diameter by 300 millimeters long, to which various weights could be applied, was first lowered axially (i.e., the 6.15 millimeter diameter end of the rod was forced into the surface) onto the surface of a 40 volume percent particulate material made according to the present approach, and in a separate test lowered onto the surface of a 38 volume percent particulate composite material prepared by infiltration and obtained from Lanxide. Prior to the test, both materials were preheated to a temperature above the melting point of the matrix, about 750° C. During a period of 5 seconds, the rod penetrated axially into the material of the present invention a depth of 1 millimeter with a weight of 15 grams applied, 4 millimeters with a weight of 35 grams applied, and greater than 30 millimeters (to the bottom of the sample in this case) with a weight of 85 grams applied. In the case of the material made by infiltration, there was no measurable surface penetration and no marking of the surface at all in 5 seconds with a weight of 160 grams applied, and a very small mark and no measurable penetration in 5 seconds with 1000 grams applied. If the rod was pushed axially into the infiltrated material with a very large force, the material cleaved but did not flow or conform to the indenter. Based upon these tests, it was concluded that a load of 300 grams on the 6.15 millimeter diameter rod will cause an axial penetration of at least 10 millimeters in 5 seconds with a material of the invention, but not with an infiltrated material. This type of test may be used to accurately distinguish the present material from infiltrated material of about the same volume fraction of particulate.

The constancy of the endpoint permits the filtration process to be used as an analytical technique. The metal filtered from the composite (filtrate) is collected and weighed, and the concentrated composite is similarly weighed. Since the composite, both before and after concentrating, has a fixed amount of solid material, the fraction of solid in the original composite may be readily determined.

Figure 4:
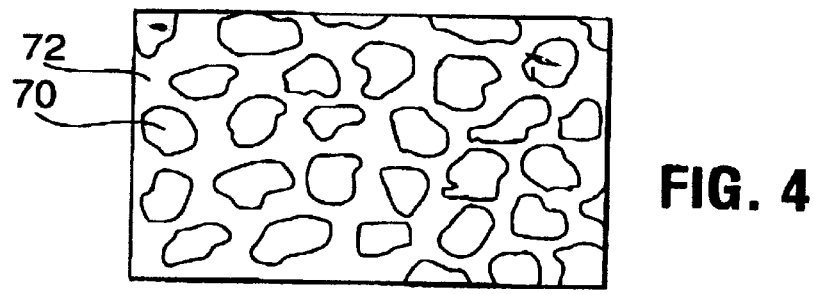
FIG. 4 is a representative microstructure of the concentrated composite material of the invention.

FIG. 4 illustrates a typical microstructure of the self-supporting mass 48 of the composite material. A plurality of particles 70 are dispersed in a metal matrix 72. When the mass is held above the melting point of the matrix metal, the metal matrix 72 is liquid, but solidifies when the mass 58 is cooled below the melting point of the metal matrix. A key feature of the invention is that in this concentrated form the particles do not agglomerate in a partially unwetted cluster, but are dispersed or, if somewhat clustered, are well wetted. They remain dispersed or at least wetted during further processing such as forming or diluting, to be described subsequently.

The self-supporting mass 58 of the concentrated composite material may be removed from the container and handled as a quasi-solid. It may be held on a solid support or carried on appropriate material handling apparatus.

The self-supporting mass 58 may be further processed, numeral 28. The further processing may take any operable form. Three preferred types of further processing are described next.

Figure 5:
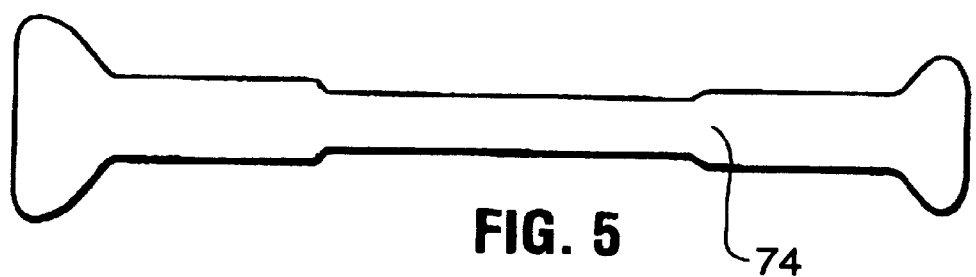
FIG. 5 is an elevational view of a shape formed according to the approach of the invention.
Figure 6:
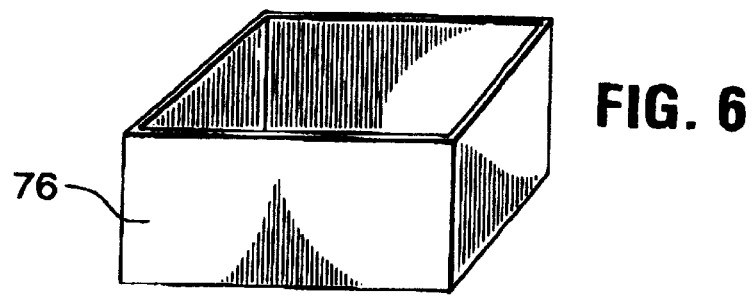
FIG. 6 is a perspective view of an electronics package made by the present approach.

In a first type of further processing, the self-supporting mass is deformed to a useful shape from its as-prepared shape. This deformation may be accomplished either without first cooling the self-supporting mass so as to solidify the matrix, or after the self-supporting mass has been first cooled to solidify the matrix. In the latter case, where the matrix has been solidified, the processing may be performed either with the matrix solid or, for some types of processing, reheated to remelt the matrix. The deforming is somewhat comparable to thixoforming practiced with slurries of some non-composite metal alloys maintained in the temperature range between the liquidus and the solidus temperatures. It bears resemblance both to thixoforging and thixocasting. The present approach differs from such thixoforming in that the solid constituent of the slurry is stable even above the liquidus temperature of the metal. Consequently, the self-supporting mass 58 may be superheated to a deformation temperature well above the liquidus temperature of the matrix alloy, to achieve better forming and filling properties. FIG. 5 illustrates a shape formed from the self-supporting mass. In this case, the self-supporting mass with the matrix molten was placed into a pressure casting apparatus comprising a ceramic sleeve with a pressure plunger, and forced by the plunger into a tensile test bar mold. The mass was cooled to solidify the matrix, producing the tensile testing bar 74. Other shapes such as an electronic package 76 shown in FIG. 6 may be prepared by this technique.

In a second type of further processing, the self-supporting mass is modified by the addition of matrix metal of the same alloy as the matrix metal in the initial composite material. The resulting dilution allows fully mixed and wetted, particulate-containing composites to be prepared with the particulate content in an intermediate range of greater than about 25 volume percent and less than about 37–45 volume percent particulate.

In a third type of further processing, the self-supporting mass is modified by the addition of matrix metal of a different alloy composition than the matrix metal in the initial composite material. Even in the concentrated self-supporting mass 58, the matrix alloy is present in an amount of about 60 volume percent. Addition of a different matrix alloy achieves a partial or even a complete replacement of the matrix to the new alloy composition, and may be accompanied by dilution of the particle concentration. New useful matrix alloys may be prepared by selecting the composition and amount of the addition to be such that the volume-weighted average of the matrix alloy in the self-supporting mass and the added second matrix alloy achieves the desired composition. The procedure allows fully mixed and wetted, particulate-containing composites to be prepared with the particulate content in an intermediate range of greater than about 25 volume percent and less than about 37–45 volume percent particulate. In addition, the composition of the matrix may be varied to compositions that are not otherwise producible by the direct mixing approach.

In performing the matrix addition according to the second and third types of further processing, any operable approach may be used. In one approach, the additive matrix material in molten form may be placed into a separate container. The self-supporting mass is placed into the container, broken up mechanically, and stirred into the metallic molten additive material. In another approach most usefully applied in relation to the third type of further processing, the added alloy of different composition than the matrix is placed on top of the mass 58 while it is still within the container 42, and gradually drawn through the mass 58 concurrent with the removal of matrix alloy through the porous element 48, to achieve a partial or even a complete replacement of the original matrix material of the initial composite.

The following examples illustrate aspects of the present approach, but are not to be taken as limiting of the approach in any way.

EXAMPLE 1

A metal matrix composite containing 20 volume percent silicon carbide (SiC) particles, of an average particle size of about 13 micrometers, in an A359 aluminum alloy matrix was prepared and processed as described above. (A359 alloy has a nominal composition, in weight percent, of 8.3–9.5 percent silicon, 0.45–0.65 percent magnesium, 0.2 percent maximum iron, 0.2 percent maximum copper, 0.2 percent maximum titanium, 0.10 percent maximum other elements, balance aluminum.) A total of 1.5 kg of this composite was poured into the apparatus 40, as shown in FIG. 2, having a mesh filter porous element 48 with an average pore size of about 240 micrometers. A vacuum was applied downstream of the porous element, producing a pressure differential of less than 1 atmosphere across the charge and porous element. Matrix alloy flowed through the porous element, causing the solids loading of the charge remaining in the container to increase. When no further metal flowed, a sample of the charge remaining in the container was removed for analysis. The solids loading was determined to be 40 volume percent. The remainder of the billet was deformed using a pressure casting process as described above, to make tensile testing bars 74.

EXAMPLE 2

A metal matrix composite containing 20 volume percent aluminum oxide, having an average particle size of about 17 micrometers, in an Al—1% Mg matrix alloy was treated by the process described above in relation to Example 2. After filtering, the solids loading was 40 volume percent. The billet was deformed as in the previous example.

EXAMPLE 3

Figure 7:
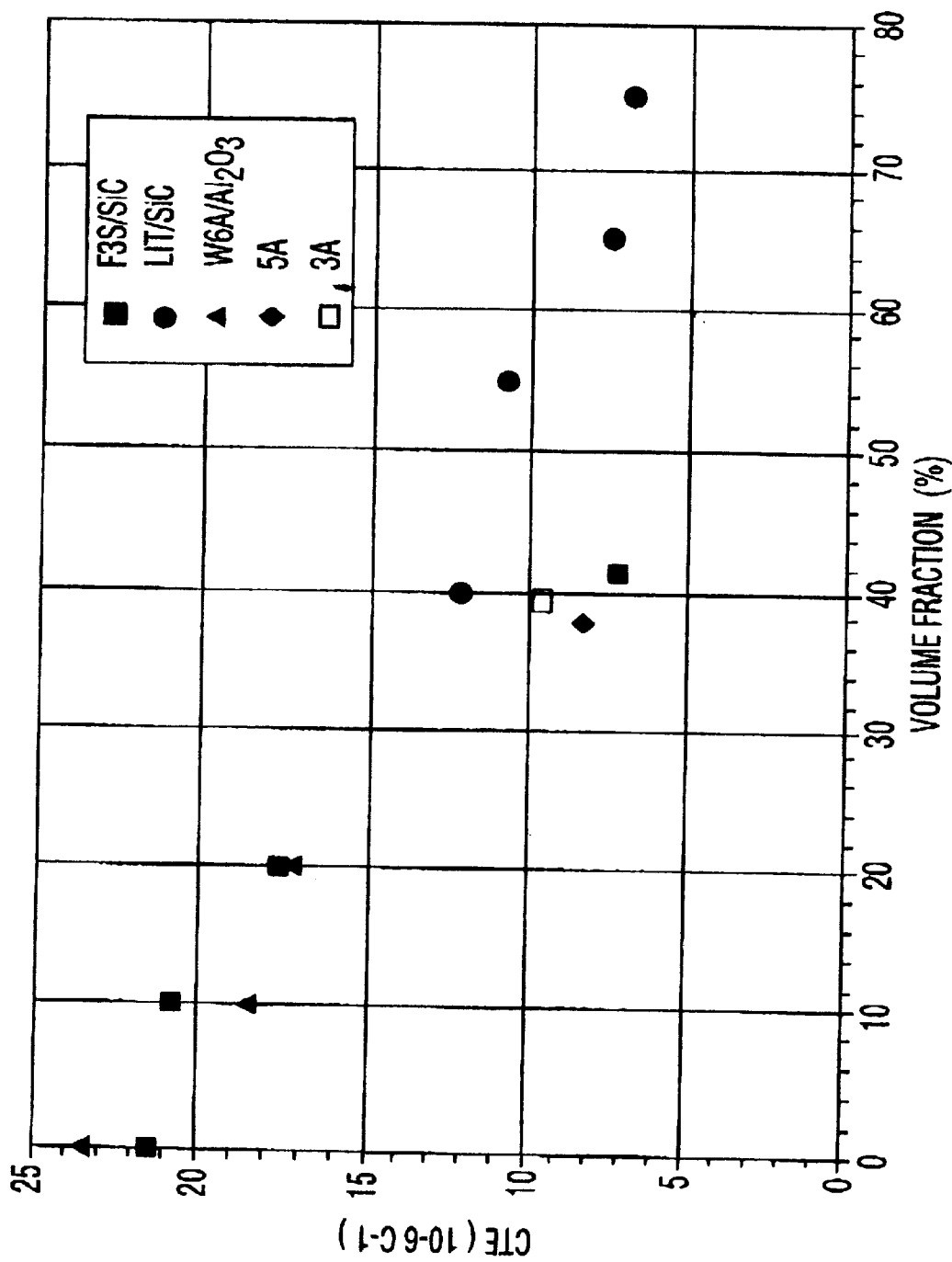
FIG. 7 is a plot of the coefficient of thermal expansion of the material of this invention compared to prior art materials

The coefficient of thermal expansion (CTE) of various materials of this invention was measured and compared to published values of CTE for metal matrix composites over a range of solids loadings. The results are shown in FIG. 7 and demonstrate the substantially lower CTE achieved by the present approach at a solids loading of about 40%. In FIG. 7, the LIT/SiC material is an infiltrated composite material whose thermal expansion properties are reported in M. K. Premkumar et al., Aluminum Composite Materials for Multichip Modules", Journal of Metals, July 1992, pages 24–28. The remaining materials are various materials made according to the present invention (for the 40 percent volume percent particulate material) or by conventional mixing (for the material having 20 volume percent or less particulate material). The F3S/SiC material has an A359 matrix and SiC particles, and the W6A/Al2O3, 5A, and 3A materials all have an AA6061 matrix and aluminum oxide particles. To achieve the low CTE of the present approach at 40 volume percent, with a conventional metal matrix composite, would require a solids loading of about 60 percent or more, and such materials would not be castable into shapes.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for preparing a metal matrix composite material, comprising the steps of:
   providing an initial composite material having
      a plurality of particles with an average particle size, and
      a molten metal matrix, wherein the initial composite material has a particle volume fraction of at least about 5 percent;
   providing a container having an exit channel, and a porous element within the exit channel, the porous element having an average pore size opening such that, under a pressure differential, molten matrix metal but no substantial amount of particles pass through the porous element;
   placing the initial composite material into the container in contact with the porous element; and
   creating a pressure differential in the initial composite material across the porous element sufficient to cause some of the matrix metal to flow through the porous element, leaving a concentrated composite material in the container, wherein the step of creating a pressure differential is continued for a time sufficient that the concentrated composite material is a self-supporting mass of particles in a liquid metal matrix material.

2. The method of claim 1, wherein the exit channel is at a lower end of the container.

3. The method of claim 1, wherein the step of creating a pressure differential includes the step of
   applying a positive pressure to the initial composite material.

4. The method of claim 1, wherein the step of creating a pressure differential includes the step of
   drawing a vacuum on the side of the porous element remote from the initial composite material.

5. The method of claim 1, wherein the pressure differential is from about 0.2 atmospheres to about 2 atmospheres.

6. The method of claim 1, wherein the initial composite material has a particle volume fraction of from about 5 percent to about 25 percent.

7. The method of claim 1, wherein the concentrated composite material has a particle volume fraction of from about 37 percent to about 45 percent.

8. The method of claim 1, wherein the average pore size in the porous element is at least 2 times the average particle size.

9. The method of claim 1, wherein the average pore size in the porous element is at least 5 times the average particle size.

10. The method of claim 1, wherein the average pore size in the porous element is less than 25 times the average particle size.

11. The method of claim 1, wherein the metal matrix comprises an aluminum alloy.

12. The method of claim 1, including an additional step, after the step of creating a pressure differential, of
    adding a second molten matrix metal to the concentrated composite material.

13. The method of claim 1, including an additional step, after the step of creating a pressure differential, of
    adding an addition amount of the molten matrix metal to the concentrated composite material.

14. The method of claim 1, including an additional step, after the step of creating a pressure differential, of
    deforming the concentrated composite material from a first shape to a second shape.

15. The method of claim 14, wherein the step of deforming includes the step of
    pressure casting the concentrated composite material.

16. The method of claim 14, wherein the shape is an electronic packaging component.

17. The method of claim 1, including the additional steps of
    measuring the amount of matrix metal which flows through the porous element, and
    calculating the particle volume fraction of the initial composite material responsive to the step of measuring.

18. The method of claim 1, wherein the step of providing an initial composite material includes the step of
    providing scrap articles.

19. A method for preparing a metal matrix composite material, comprising the steps of:
    providing an initial composite material having
       a plurality of particles with an average particle size, and
       a molten metal matrix, wherein the initial composite material has a particle volume fraction of from about 5 percent to about 25 percent;
    providing a porous element having an average pore size opening of from about 2 to about 25 times the average particle size;
    contacting the initial composite material to the porous element; and
    creating a pressure differential in the initial composite material across the porous element sufficient to cause the matrix metal to flow through the porous element, leaving a concentrated composite material in the container, wherein the step of creating a pressure differential is continued for a time sufficient that the concentrated composite material has a particle volume fraction of from about 37 percent to about 45 percent.

* * * * *